(12) United States Patent
Suzukawa

(10) Patent No.: US 6,784,974 B1
(45) Date of Patent: Aug. 31, 2004

(54) EXPOSURE METHOD AND EXPOSURE APPARATUS

(75) Inventor: Hiroki Suzukawa, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 177 days.

(21) Appl. No.: 09/668,064

(22) Filed: Sep. 25, 2000

(30) Foreign Application Priority Data

Sep. 24, 1999 (JP) ............................................ 11-270688

(51) Int. Cl.⁷ ...................... G03B 27/42; G03B 27/52; G03B 27/32; G01B 11/00
(52) U.S. Cl. ............................. 355/53; 355/55; 355/77; 356/399
(58) Field of Search .............................. 355/53, 77, 40, 355/50, 55; 356/399, 400, 401

(56) References Cited

U.S. PATENT DOCUMENTS 6,163,366 A * 12/2000 Okamoto et al. ............. 355/53
6,342,942 B1 * 1/2002 Uzawa ........................ 355/53

* cited by examiner

Primary Examiner—Peter B Kim
(74) Attorney, Agent, or Firm—Fitzpatrick, Cella, Harper & Scinto

(57) ABSTRACT

An exposure method and an exposure apparatus in which one or more plural sample shot processes are made to a substrate and an exposure process is made to the substrate after completion of the sample shot process or processes. The procedure includes a first determining step for determining the processing order in a first sample shot process, of the plural sample shot processes, and a second determining step for determining the processing order in a second sample shot process to be made after the first sample shot process. In at least one of the first and second determining steps, the determination is made under a condition that an interval between a shot to be processed last in the first sample shot process and a shot to be processed first in the second sample shot process is shortened.

33 Claims, 11 Drawing Sheets

|  | 29 | 30 | 31 | 32 |  |
|---|---|---|---|---|---|
| 28 | Aa 27 | Ta 26 | 25 | Ad 24 | 23 |
| 17 | Pa 18 | 19 | 20 | Td 21 | 22 |
| 16 | Tb 15 | 14 | 13 | Pb 12 | 11 |
| 5 | Ab 6 | 7 | Tc 8 | Ac 9 | 10 |
|  | 4 | 3 | 2 | 1 |  |

FIG. 3

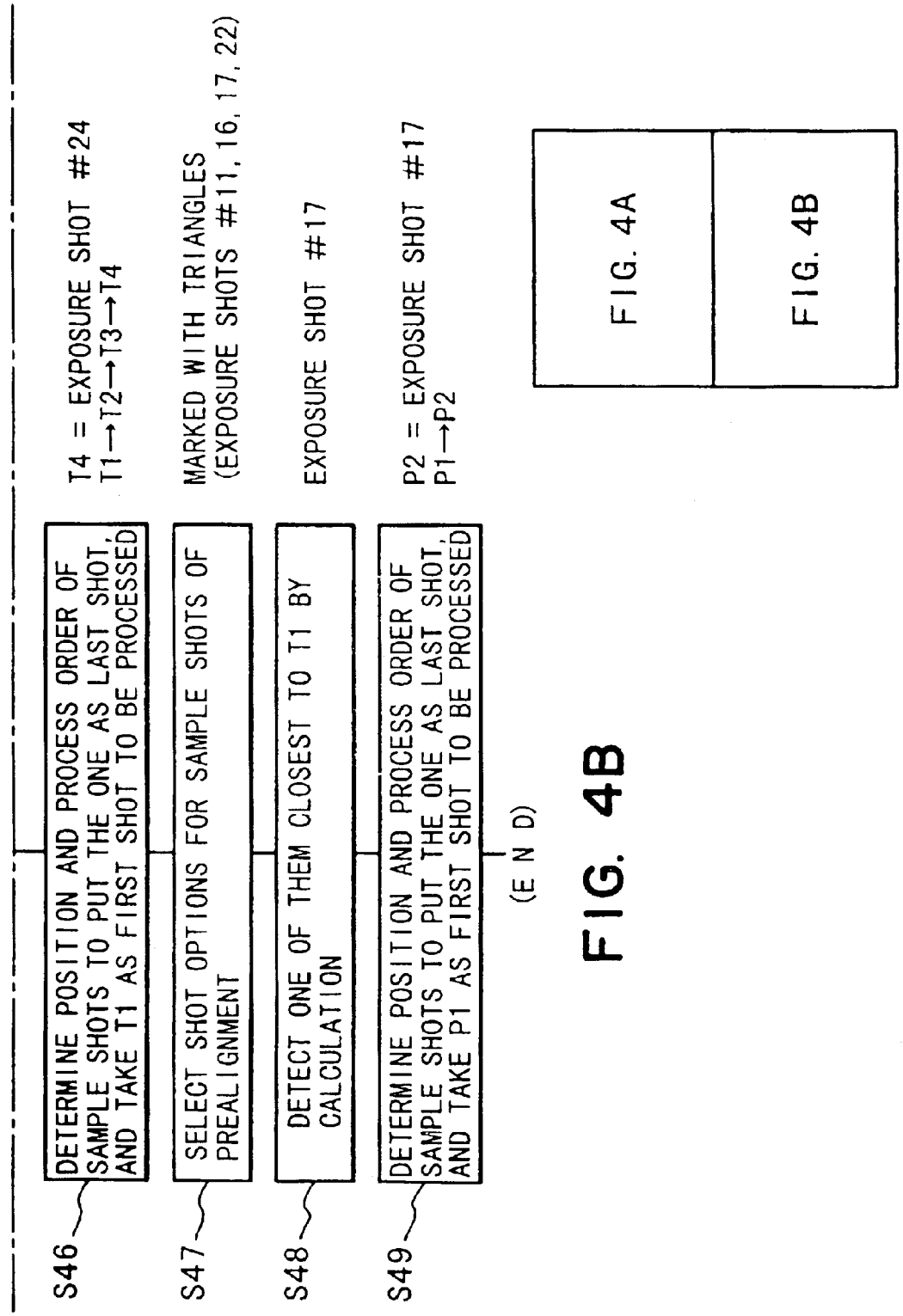

FIG. 5

|  | Ea 32 | 31 | 30 | Ed 29 |  |
|---|---|---|---|---|---|
| 23 | Aa 24 | Ta 25 | 26 | Ad 27 | 28 |
| 22 | Pa 21 | 20 | 19 | Td 18 | 17 |
| 11 | Tb 12 | 13 | 14 | Pb 15 | 16 |
| 10 | Ab 9 | 8 | Tc 7 | Ac 6 | 5 |
|  | Eb 1 | 2 | 3 | Ec 4 |  |

FIG. 7

START FROM Ea

|    | 1  | 2  | 3  | 4  |    |
|----|----|----|----|----|----|
| 10 | 9  | 8  | 7  | 6  | 5  |
| 11 | 12 | 13 | 14 | 15 | 16 |
| 22 | 21 | 20 | 19 | 18 | 17 |
| 23 | 24 | 25 | 26 | 27 | 28 |
|    | 32 | 31 | 30 | 29 |    |

FIG. 8A

START FROM Ed

|    | 4  | 3  | 2  | 1  |    |
|----|----|----|----|----|----|
| 5  | 6  | 7  | 8  | 9  | 10 |
| 16 | 15 | 14 | 13 | 12 | 11 |
| 17 | 18 | 19 | 20 | 21 | 22 |
| 28 | 27 | 26 | 25 | 24 | 23 |
|    | 29 | 30 | 31 | 32 |    |

FIG. 8D

START FROM Eb

|    | 32 | 31 | 30 | 29 |    |
|----|----|----|----|----|----|
| 23 | 24 | 25 | 26 | 27 | 28 |
| 22 | 21 | 20 | 19 | 18 | 17 |
| 11 | 12 | 13 | 14 | 15 | 16 |
| 10 | 9  | 8  | 7  | 6  | 5  |
|    | 1  | 2  | 3  | 4  |    |

FIG. 8B

START FROM Ec

|    | 29 | 30 | 31 | 32 |    |
|----|----|----|----|----|----|
| 28 | 27 | 26 | 25 | 24 | 23 |
| 17 | 18 | 19 | 20 | 21 | 22 |
| 16 | 15 | 14 | 13 | 12 | 11 |
| 5  | 6  | 7  | 8  | 9  | 10 |
|    | 4  | 3  | 2  | 1  |    |

FIG. 8C

EXPOSURE METHOD AND EXPOSURE APPARATUS

FIELD OF THE INVENTION AND RELATED ART

This invention relates to an exposure method, a device manufacturing method and an exposure apparatus, wherein an exposure process-for a substrate such as a wafer is performed after one or more sample shot processes are carried out thereto.

The wafer processing procedure for producing "exposed wafers" mainly comprises sample shot processes such as global tilting for removing any tilt of a wafer and global alignment for positioning the wafer, as well as an exposure process. Many attempts have been made to shorten the time required for each process, to thereby improve the productivity of "exposed wafers", that is, the throughput.

However, as regards the time for transition from a certain sample shot process to another sample shot process or the time for transition from a sample shot process to an exposure process (hereinafter, "transition time"), no particular attention has been paid thereto because it is very short as compared with the time required for each sample shot process itself.

SUMMARY OF THE INVENTION

It is an object of the present invention to enable shortening of such transition time to thereby increase the throughput.

It is another object of the present invention to provide an exposure method, an exposure apparatus and/or a device manufacturing method by which the transition time is shortened.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view of an example of a wafer shot layout, to be processed in relation to the flow chart of FIG. 2.

FIG. 4, including FIGS. 4A and 4B, is a flow chart for explaining the sequence flow for determining the positions of and the order of processing sample shots in each sample shot process to be done in relation to the wafer processing procedure of FIG. 1 and to be made to a wafer having a shot layout such as shown in FIG. 5.

FIG. 5 is a schematic view of an example of a wafer shot layout, to be processed in relation to the flow chart of FIG. 4.

FIG. 7 is a schematic view of an example of a wafer shot layout, to be processed in relation to the flow chart of FIG. 6.

FIGS. 8A–8D are schematic views, respectively, for explaining examples of a first processing shot in an exposure process and the order of processing the remaining shots in that process, as determined in accordance with the sequence flow of the FIG. 6 example.

DESCRIPTION OF THE PREFERRED EMBODIMENTS

Preferred embodiments of the present invention will now be described with reference to the accompanying drawings. Briefly, in these embodiments, the order of processing sample shots, the positions of sample shots, the processing order in an exposure process and the like may be determined so as to shorten the distance between the last shot in a certain sample shot process and the first shot in a subsequent sample shot process and/or the distance between the last shot in a certain sample shot process and the first shot in a subsequent exposure process (hereinafter, "transition distance"). This effectively shortens the movement time for a stage which moves through the transition distance.

Figure 1:
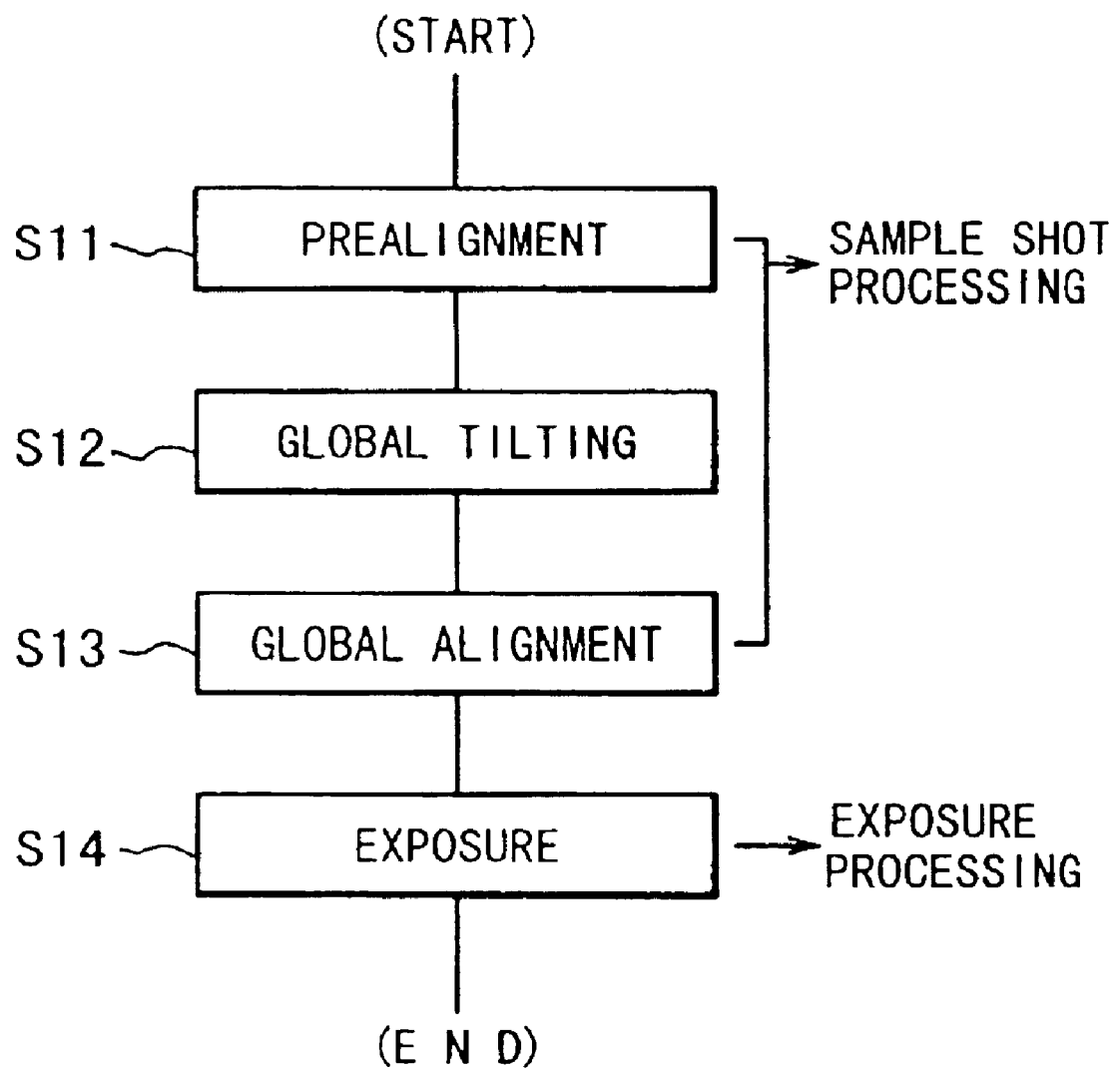
FIG. 1 is a flow chart for explaining the sequence flow of a wafer processing procedure, in an embodiment of the present invention.

FIG. 1 shows a sequence flow of a wafer processing procedure in an embodiment of the present invention. As shown in the drawing, as the wafer processing procedure starts, sample shot processes of prealignment (step S11), global tilting (step S12) and global alignment (step S13) are made to a wafer placed on a wafer stage, in the named order. Then, finally, an exposure process is carried out (step S14).

As regards the prealignment process, the wafer stage is moved to each sample shot, and the position of a prealignment mark or marks there is measured. On the basis of the results of measurements, the wafer is roughly positioned. In the global tilting process, the wafer stage is moved to each sample shot, and the focus threat is measured. On the basis of the results of measurements, any tilt of the wafer is removed so that the surface of the wafer to be exposed is placed horizontally. Then, in the global alignment process, the wafer stage is moved to each sample shot, and the position of an alignment mark or marks there is measured. On the basis of the results of measurements, the wafer is positioned precisely. After the precise positioning, the wafer stage is moved to each shot, and exposures of these shots are performed.

There is a transition time from a certain sample shot process to another sample shot process, or from a certain sample shot process to an exposure process. Also, there is a transition distance from the last shot in a certain sample shot process to the first shot in a subsequent sample shot process or from the last shot in a certain sample shot process to the first shot of an exposure process. In some examples to be described below, the order of processing sample shots, the position of each sample shot, and/or the order of processing shots in an exposure process is determined so as to reduce the transition distance described above, thereby to reduce the movement time of a stage which moves through the transition distance. In this manner, the transition time described above can be shortened.

[Example of Determining Sample Shot Processing Order]

Figure 2:
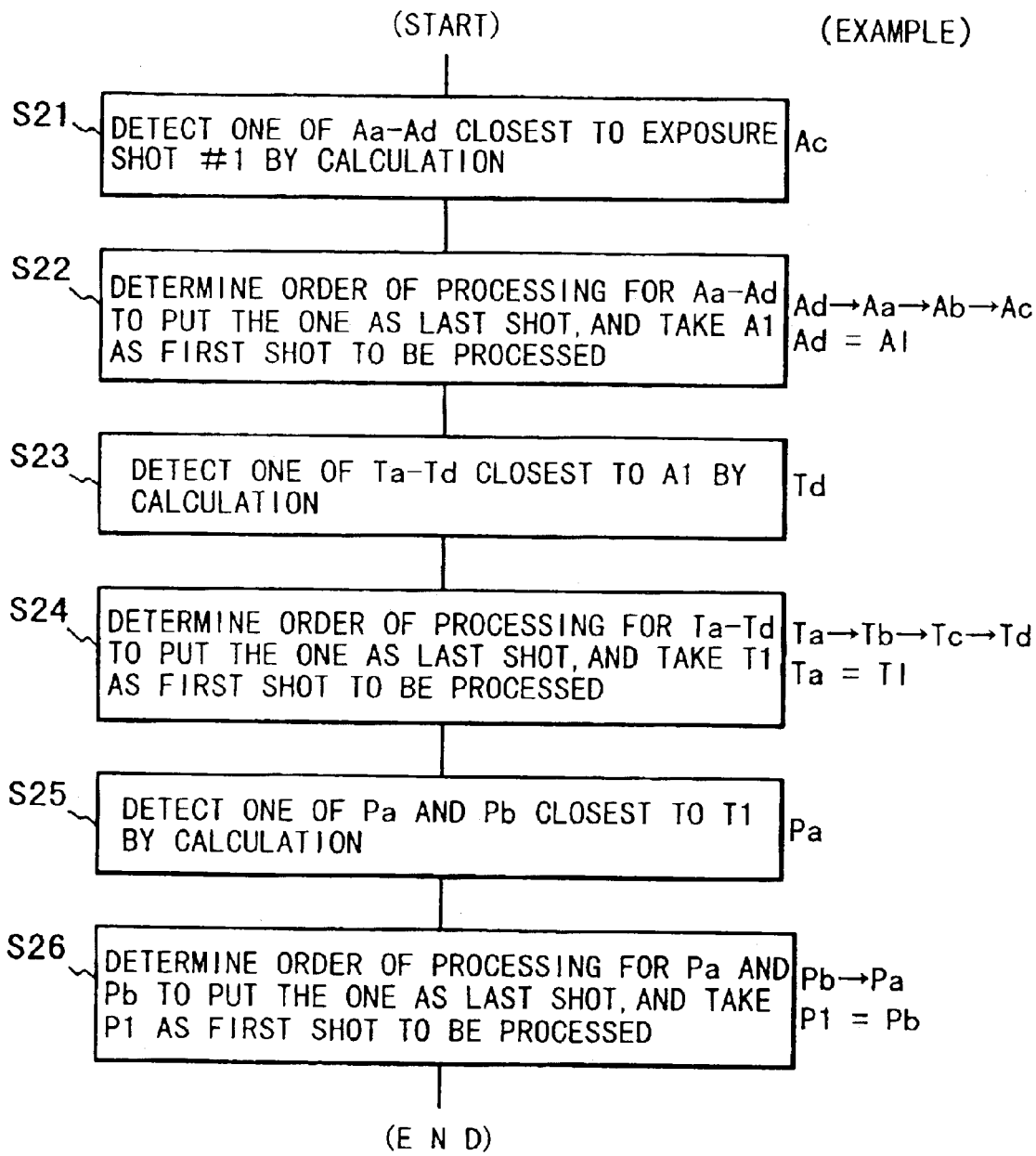
FIG. 2 is a flow chart for explaining the sequence flow for determining the order of processing sample shots in each sample shot process to be done in relation to the wafer processing procedure of FIG. 1 and to be made to a wafer having a shot layout such as shown in FIG. 3.

FIG. 2 shows a sequence flow for determining the order of processing sample shots in each sample shot process to be made to a wafer having a shot layout such as shown in FIG. 3. The number of sample shots and positions of them in each sample shot process as well as the shot layout in an exposure process are selectable. FIG. 3 shows an example of selection. In FIG. 3, Pa and Pb denote sample shots for prealignment (two shots in this example), Ta–Td denote sample shots for global tilting (four shots in this example), and Aa–Ad are sample shots for global alignment (four shots in this example). Numbers 1–32 denote exposure shot Nos., and the exposure shots No.1–No. 32 are to be exposed in this numerical order.

As the sequence starts, first, one of the sample shots Aa–Ad which is closest to the exposure shot No. 1 is determined by calculation on the basis of the X-Y coordinate positions of them (step S21). More specifically, when the X-Y coordinate of the exposure shot No. 1 is $(X_1, Y_1)$ while the X-Y coordinates of the sample shots Aa–Ad are (Xa, Ya), (Xb, Yb), (Xc, Yc) and (Xd, Yd), respectively, the distances Da–Dd of the sample shots Aa–Ad from the exposure shot No. 1 are given by the following equations.

$$Da = \sqrt{[(Xa - X_1)^2 + (Ya - Y_1)^2]}$$
$$Db = \sqrt{[(Xb - X_1)^2 + (Yb - Y_1)^2]}$$
$$Dc = \sqrt{[(Xc - X_1)^2 + (Yc - Y_1)^2]}$$
$$Dd = \sqrt{[(Xd - X_1)^2 + (Yd - Y_1)^2]}$$

Thus, the one shot which corresponds to the smallest one of Da–Dd is detected. In this example, the sample shot Ac is determined so.

Next, the processing order for the sample shots Aa–Ad is so determined that the thus detected shot is taken as the last shot. The first shot to be processed first is named as shot $A_1$ (step S22). Here, in this example, in the sample shot process, the processing is going to be made to the sample shots counterclockwise. However, any other rule may be used in place of the counterclockwise processing. In this example, therefore, the sample shots will be processed in an order of Ad, Aa, Ab and Ac. The first shot $A_1$ for the global alignment process is the sample shot Ad.

The above-described procedure for determining a shot closest to a particular shot, by calculation on the basis of the X-Y coordinate position thereof, can be applied to any other case to be described below. Details of the procedure will, therefore, be omitted in the following description.

Subsequently, in a similar manner, one of the sample shots Ta–Td for the global tilting process which is closest to a first processing shot $A_1$ (Ad) in the global alignment process, is determined by calculation on the basis of the X-Y coordinate positions of them (step S23). In this example, the sample shot Td is detected so. Then, the processing order for the sample shots Ta–Td is so determined that the thus detected shot is taken as the last shot. A first shot to be processed first is named as $T_1$ (step S24). Thus, in this example, the sample shots will be processed in an order of Ta, Tb, Tc and Td. The first processing shot $T_1$ in the global tilting process is the sample shot Ta.

Subsequently, one of the sample shots Pa and Pb for the prealignment process which is closest to the first processing shot $T_1$ (Ta) in the global tilting process is determined by calculation on the basis of the X-Y coordinate positions of them (step S25). In this example, the sample shot Pa is determined so. Then, the processing order for the sample shots Pa and Pb is so determined that the thus detected shot is taken as the last shot. The first. shot to be processed first is named $P_1$ (step S26). Thus, in this example, the sample shots Pa and Pb will be processed in an order of Pb and Pa. The first shot $P_1$ to be processed first in the prealignment process is the sample shot Pb.

With the procedure described above, all the sample shot processing orders in every sample shot process are determined.

[Example of Determining Sample Shot Position and Sample Shot Processing Order]

Figure 4A:
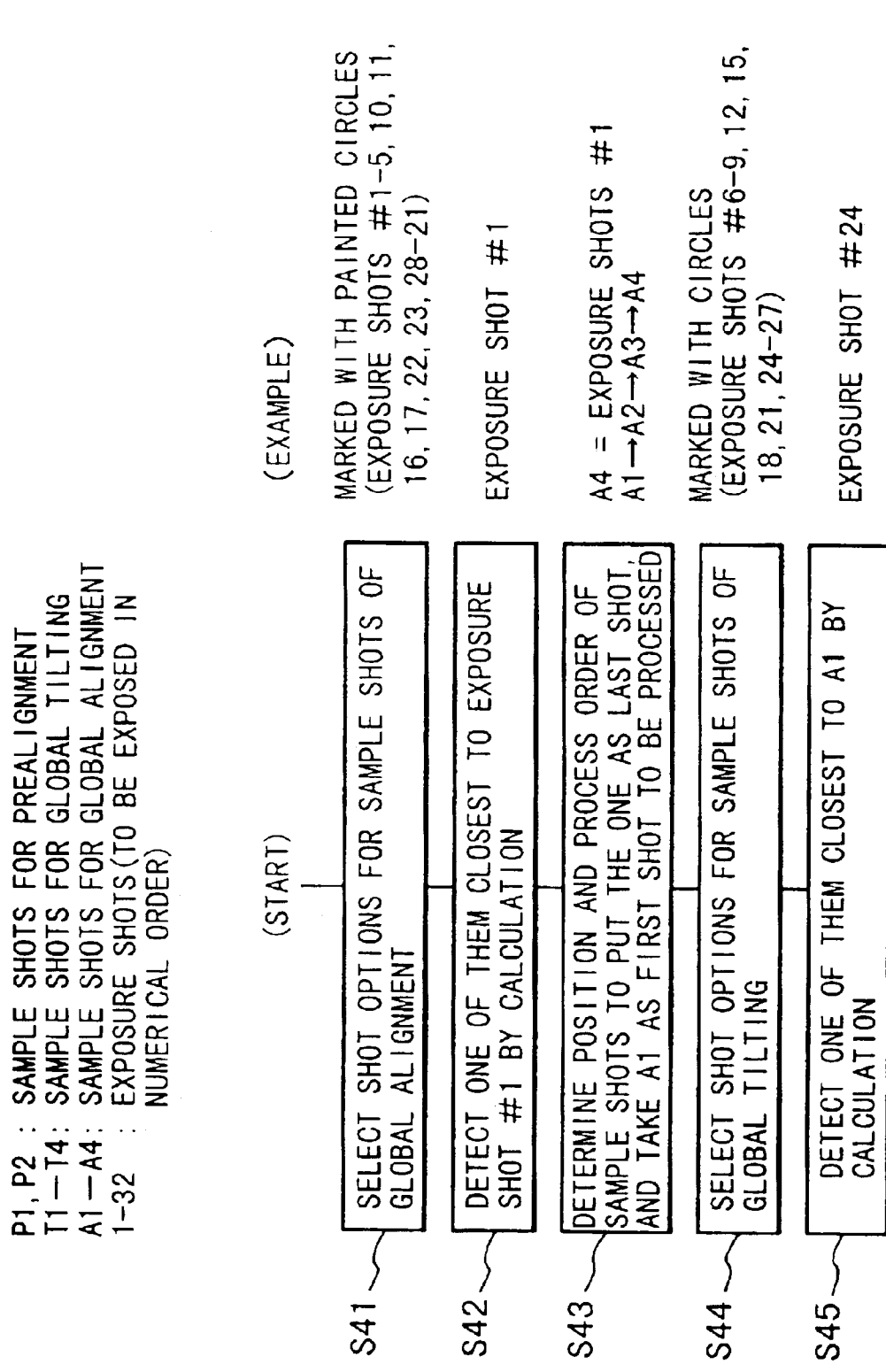
Figure 5:
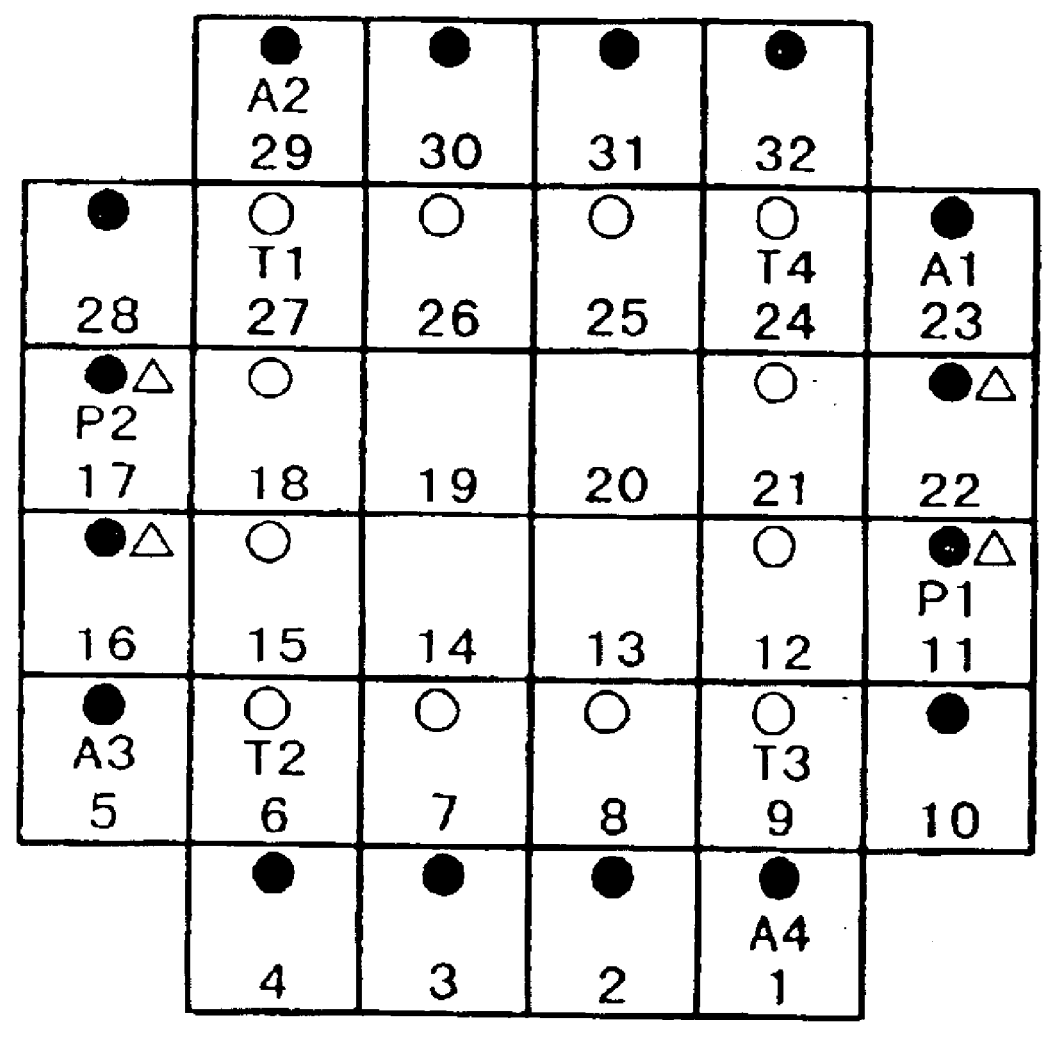

FIG. 4 shows a sequence flow for determining the order of processing sample shots in each sample shot process to be made to a wafer having a shot layout such as shown in FIG. 5. The number of sample shots in each sample shot process as well as the shot layout in the exposure process are selectable. In this example, the selection may be made to be described below. However, in this example, the number of sample shots for the prealignment process is fixed to two. More specifically, the number of sample shots for prealignment is two (fixed), the number of sample shots for global tilting is four, and the number of sample shots for global alignment is four.

As the sequence flow of FIG. 4 starts, first, shot options to be chosen as sample shots for global alignment are selected (step S41). In this example, for better correction precision to wafer magnification and wafer rotation, a condition that the options should be those shots located at the outermost periphery of the shot layout is set. Thus, in this example, the options are those shots marked with painted circles in FIG. 5, that is, the shots with exposure shot Nos. 1, 2, 3, 4, 5, 10, 11, 16, 17, 22, 23, 28, 29, 30, 31 and 32. However, any other rule may be used for selection of options.

Subsequently, among these shot options, one which is closest to the exposure shot No.1 is detected by calculation on the basis of the X-Y coordinate positions of them (step S42). In this example, the exposure shot No. 1 is determined so. Then, the positions of sample shots as well as the processing order of them are so determined that the thus detected sample shot is taken as the last shot. The first shot to be processed first is named shot $A_1$ (step S43). In this example, in the sample shot processes, the sample shots are processed in a counterclockwise order, and also these sample shots are placed equidistantly. However; any other rule may be used in place of the above. In this example, therefore, first, a shot $A_4$ (exposure shot No.1) is selected as a sample shot and, then, the remaining sample shots $A_2$–$A_4$ are so selected that all the sample shots will be processed in an order of $A_1$, $A_2$, $A_3$ and $A_4$ and also that these sample shots are placed equidistantly. Thus, the first shot $A_1$ to be processed first in the global alignment process is exposure shot No.23.

Subsequently, in a similar manner, shot options to be chosen for sample shots in the global tilting process are selected (step S44). In this example, for better correction precision to wafer tilting and for avoiding the influence of a warp of the wafer outer peripheral portion, a condition that the options should be those shots each being next pin (inwardly adjoining) to an outermost peripheral shot in the shot layout is set. However, any other rule may be used. In this example, therefore, shot options are those shots marked with non-painted circles in FIG. 5, that is, the shots with exposure shot Nos. 6, 7, 8, 9, 12, 15, 18, 21, 24, 25, 26 and 27. Next, among these shot options, one which is closest to the first processing shot $A_1$ to be processed first in the global alignment process is detected by calculation on the basis of the X-Y coordinate positions of them (step S45). In this example, a shot with exposure shot No.24 is detected so. Subsequently, the positions of sample shots as well as the processing order for them are determined so that the thus detected shot is taken as the last shot. The first shot to be processed first is named shot $T_1$ (step S46). In this example, in the sample shot process, the sample shots are processed in a counterclockwise order, and also the selection is made so that these sample shots are placed equidistantly. However, any other rule may be used in place of the above. In this example, therefore, first, a shot $T_4$ (exposure shot No.24) is selected as a sample shot and, then, the remaining sample shots $T_2$–$T_4$ are so selected that all the sample shots will be processed in an order of $T_1$, $T_2$, $T_3$ and $T_4$ and also that these sample shots are placed equidistantly. Thus, the first shot $T_1$ to be processed first in the global tilting process is exposure shot No.27.

Subsequently, shot options to be chosen for sample shots in the prealignment process are selected (step S47). In this example, for better correction precision to wafer rotation, a condition that the options should be those shots each being located at the outermost periphery of the shot layout and being present on a straight line passing through the center of the shot layout and extending parallel to the X axis, is set. However, any other rule may be used. In this example, therefore, shot options are those shots marked with triangles in FIG. 5, that is, the shots with exposure shot Nos. 11, 16, 17 and 22. Next, among these shot options, one which is closest to the first processing shot $T_1$ to be processed first in the global tilting process is detected by calculation on the basis of the X-Y coordinate positions of them (step S48). In this example, a shot with exposure shot No. 17 is detected so.

Subsequently, the positions of sample shots as well as the processing order for them are determined so that the thus detected shot is taken as the last shot. The first shot to be processed first is named shot $P_1$ (step S49). In this example, the number of sample shots for prealignment is fixed to two, and these two shots should be placed in a symmetrical relation with each other with respect to the wafer center. However, any other rule may be used. In this example, therefore, first, a shot $P_2$ (exposure shot No.17) is selected as a sample shot and, thereafter, another sample shot $P_1$ is selected so that these shots will be processed in an order of $P_1$ and $P_2$. Thus, the first processing shot $P_1$ to be processed first in the prealignment process is the shot with exposure shot No.11.

With the procedure described above, the positions of all the sample shots as well as the sample shot processing orders in every sample shot process are determined.

[Example of Determining Processing Order of Sample Shots and Exposure Shots]

Figure 6:
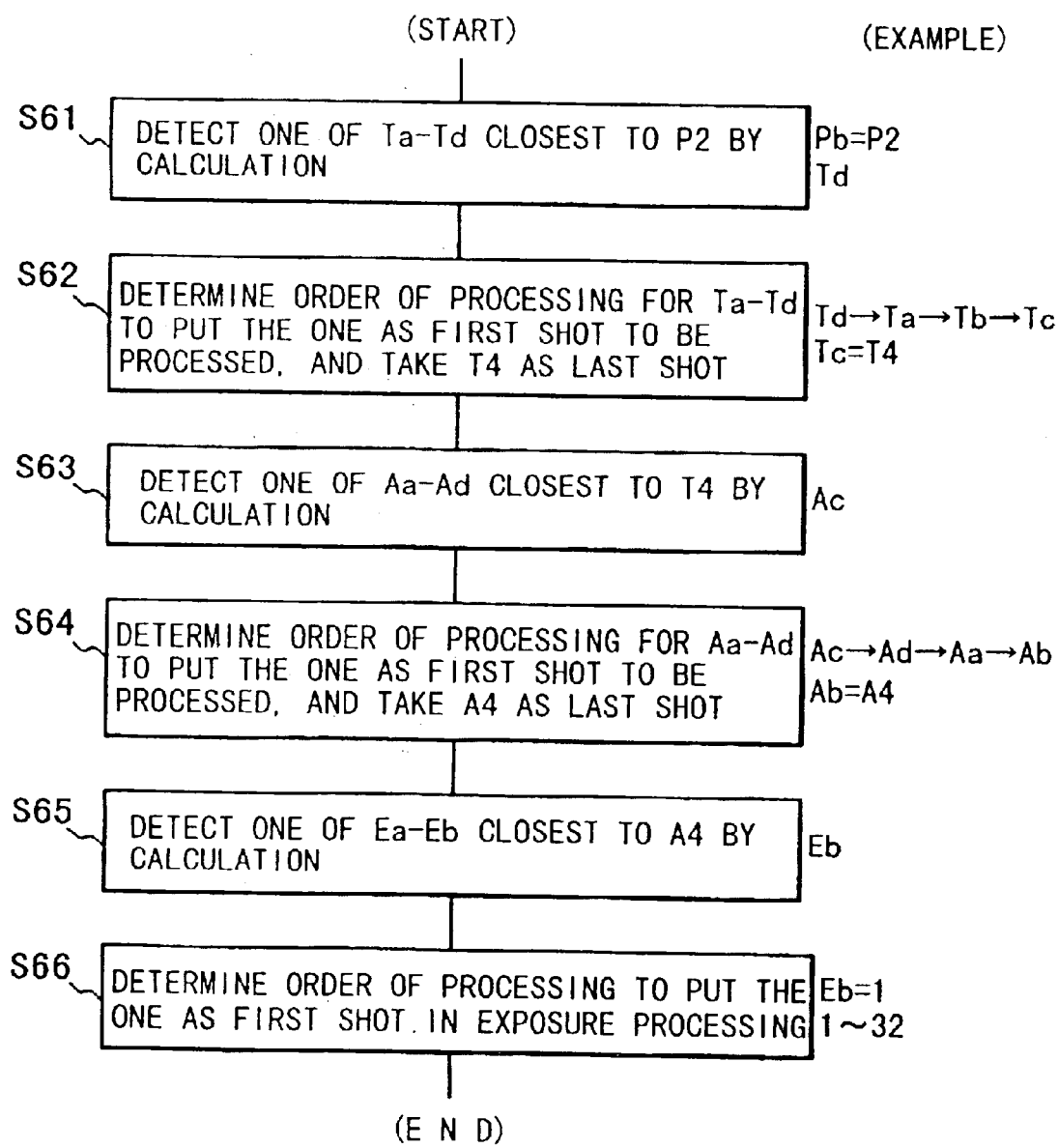
FIG. 6 is a flow chart for explaining the sequence flow for determining the order of processing sample shots in each sample shot process and the order of processing exposure shots in an exposure process which are to be done in relation to the wafer processing procedure of FIG. 1 and to be made to a wafer having a shot layout such as shown in FIG. 7.

FIG. 6 shows a sequence flow for determining the order of processing sample shots in each sample shot process as well as the order of processing exposure shots in an exposure process which are to be made to a wafer having a shot layout such as shown in FIG. 7. The number of sample shots and positions of them in each sample shot process as well as the shot layout in the exposure process are selectable. FIG. 7 shows an example of the selection. Here, it is assumed that the processing order for sample shots in the prealignment process is already determined as an order of Pa and Pb, and that the exposure order is not yet determined. In FIG. 7, Pa and Pb denote sample shots for prealignment (two shots in this example), Ta–Td denote sample shots for global tilting (four shots in this example), and Aa–Ad are sample shots for global alignment (four shots in this example). Also, Ea–Ed denote shot options for a first processing shot to be processed first in the exposure process. Numbers 1–32 denote exposure shot numbers. The order of exposure shots is determined in accordance with the first processing shot. In this example, the shot options to be chosen for the first processing shot in the exposure process should be those shots which are located at the opposite ends of the top or bottom array (row) of the shot layout, that is, shots Ea–Ed. Also, when any one of these shots is selected as the first processing shot, the processing order will be determined in a manner as shown in a corresponding one of FIGS. 8A–8D. However, any other rule may be used.

The processing order in the prealignment process is in the order of Pa and Pb, as described above. Thus, as the sequence starts, first, one of the sample shots Ta–Td which is closest to the Pb is determined by calculation on the basis of the X-Y coordinate positions of them (step S61). In this example, the sample shot Td is determined so. Subsequently, the processing order for the sample shots Ta–Td is so determined that the thus detected shot is taken as the first shot. The last shot to be processed last is named as shot $T_4$ (step S62). Here, in this example, in the sample shot process, the processing is going to be made to the sample shots counterclockwise. However, any other rule may be used in place of the counterclockwise processing. In this example, therefore, the sample shots will be processed in an order of Td, Ta, Tb, and Tc. The first last shot $T_4$ for the global tilting process is the sample shot Tc.

Subsequently, in a similar manner, one of the sample shots Aa–Ad which is closest to the shot $T_4$ (shot Tc) is determined by calculation on the basis of the X-Y coordinate positions of them (step S63). In this example, the sample shot Ac is detected so. Then, the processing order for the sample shots Aa–Ad is so determined that the thus detected shot is taken as the first processing shot to be processed first. The last shot to be processed last is named as $A_4$ (step S64). Thus, in this example, the sample shots will be processed in an order of Ac, Ad, Aa and Ab. The last shot $A_4$ in the global alignment process is the sample shot Ab.

Subsequently, among the shots Ea–Eb, one which is closest to the shot $A_4$ (shot Ab) is detected by calculation on the basis of the X-Y coordinate positions of them (step S65). In this example, the shot Eb is determined so. Thus, the first processing shot to be processed first in the exposure process is the shot Eb. Also, the order of an exposure process corresponding to this is determined such as shown in FIG. 8B (step S66).

With the procedure described above, the order of processing sample shots in each sample shot process as well as the order of processing exposure shots in the exposure process are determined.

[Embodiment of Device Manufacturing Method]

Next, an embodiment of a semiconductor device manufacturing method which uses an exposure method according to any one of the preceding examples, will be explained.

Figure 9:
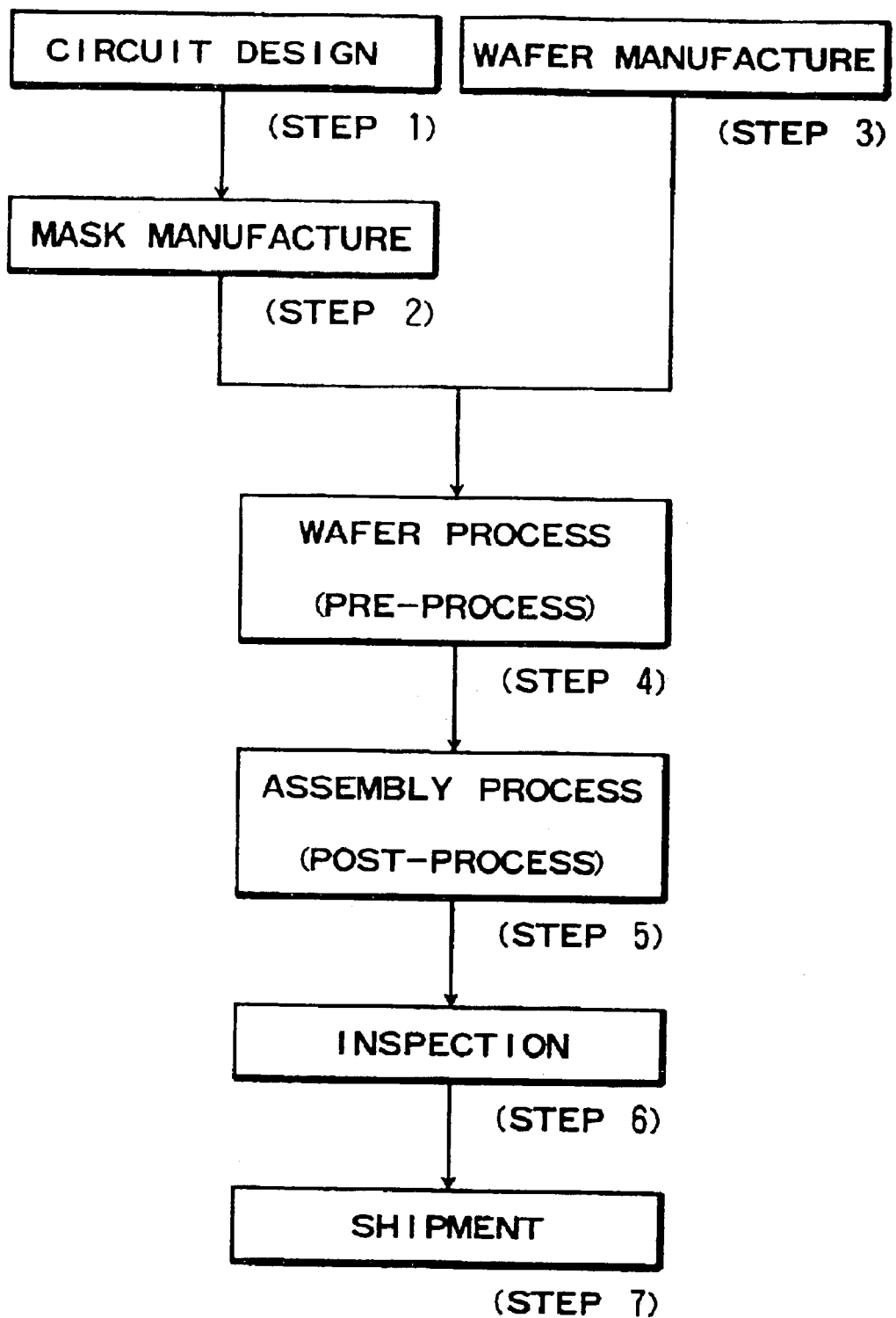
FIG. 9 is a flow chart of microdevice manufacturing processes.

FIG. 9 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 10:
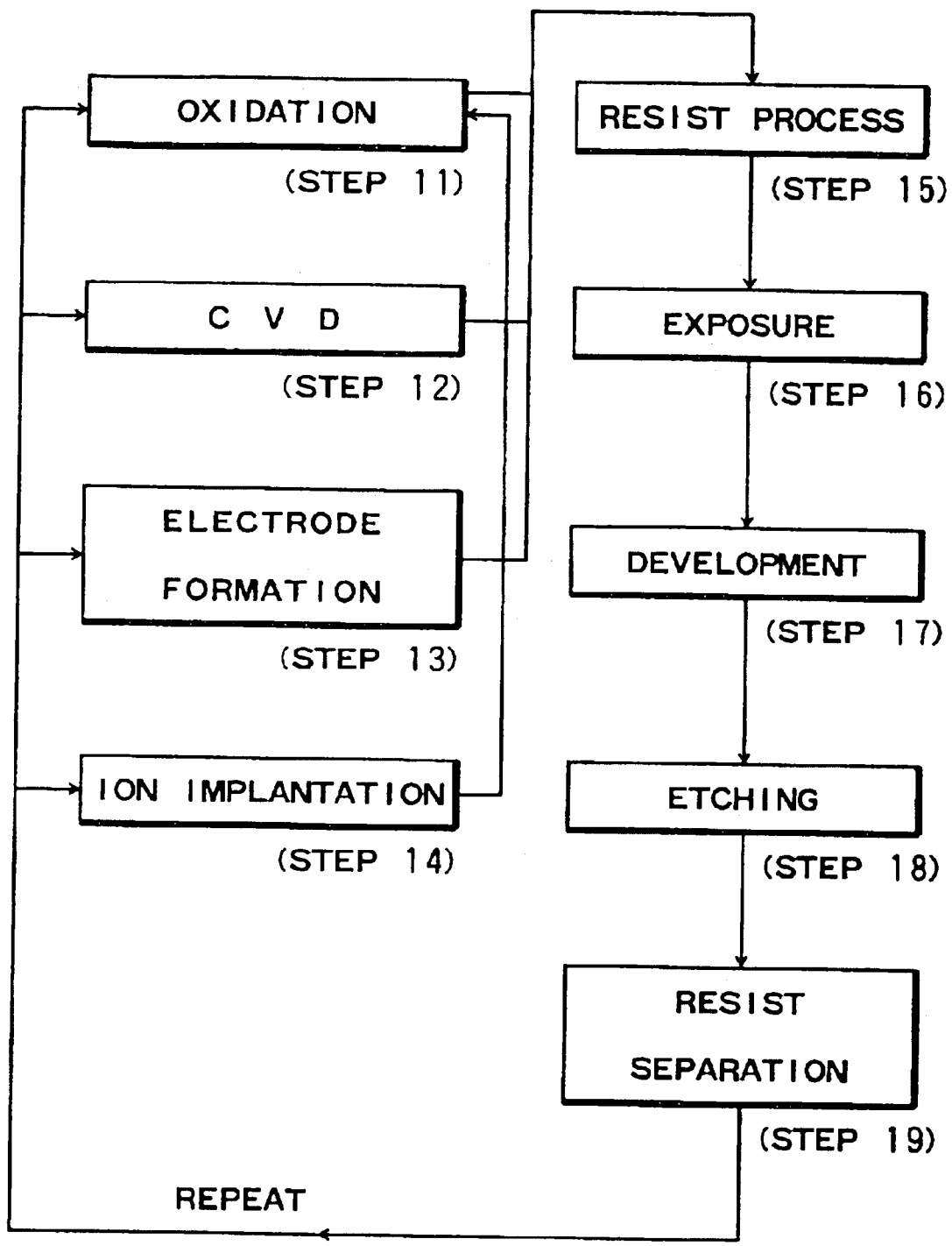
FIG. 10 is a flow chart for explaining details of a wafer process included in the procedure of FIG. 9.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured, with a higher productivity.

In accordance with the embodiments of the present invention as described hereinbefore, the transition distance which corresponds to the distance between the last shot in a certain sample shot process and the first shot in a subsequent sample shot process or the distance between the last shot in a certain sample shot process and the first shot in a subsequent exposure process, can be shortened significantly. Therefore, the movement time of a stage which moves through the transition distance can be shortened significantly. As a result, a processing time per a single substrate to be exposed can be reduced effectively, and also the productivity of "exposed wafers", that is, the throughput, can be improved significantly.

While the invention has been described with reference to the structures disclosed herein, it is not confined to the details set forth and this application is intended to cover such modifications or changes as may come within the purposes of the improvements dr the scope of the following claims.

What is claimed is:

1. An exposure method including plural sample shot processes to be made to a substrate and an exposure process to be made to the substrate after completion of the sample shot processes, said method comprising:
   a first determining step for determining the processing order in a first sample shot process, of the plural sample shot processes; and
   a second determining step for determining the processing order in a second sample shot process to be made after the first sample shot process,
   wherein, in at least one of said first and second determining steps, the determination is made under a condition that an interval between a shot to be processed last in the first sample shot process and a shot to be processed first in the second sample shot process is shortened.

2. A method according to claim 1, wherein, in said at least one determining step, positions of sample shots are also determined.

3. An exposure method including a sample shot process to be made to a substrate and an exposure process to be made to the substrate after completion of the sample shot process, said method comprising:
   a first determining step for determining the processing order in the sample shot process; and
   a second determining step for determining the processing order in the exposure process to be made after the sample shot process,
   wherein, in at least one of said first and second determining steps, the determination is made under a condition that an interval between a shot to be processed last in the sample shot process and a shot to be processed first in the exposure process is shortened.

4. A method according to claim 3, wherein, in said at least one determining step, positions of sample shots are also determined.

5. An exposure method including plural sample shot processes to be made to a substrate and an exposure process to be made to the substrate after completion of the sample shot processes, said method comprising:
   a first determining step for determining the processing order in a first sample shot process, of the plural sample shot processes; and
   a second determining step for determining the processing order in a second sample shot process to be made after the first sample shot process, in accordance with a position of a shot to be processed last in the first sample shot process.

6. An exposure method including plural sample shot processes to be made to a substrate and an exposure process to be made to the substrate after completion of the sample shot processes, said method comprising:
   a first determining step for determining the processing order in a first sample shot process, of the plural sample shot processes; and
   a second determining step for determining the processing order in a second sample shot process to be made prior to the first sample shot process, on the basis of a position of a shot to be processed first in the first sample shot process.

7. An exposure method including a sample shot process to be made to a substrate and an exposure process to be made to the substrate after completion of the sample shot process, said method comprising:
   a first determining step for determining the processing order in the sample shot process; and
   a second determining step for determining the processing order in the exposure process to be made after the sample shot process, in accordance with a position of a shot to be processed last in the sample shot process.

8. An exposure method including a sample shot process to be made to a substrate and an exposure process to be made to the substrate after completion of the sample shot process, said method comprising:
   a first determining step for determining the processing order in the exposure process; and
   a second determining step for determining the processing order in the sample shot process to be made prior to the exposure process, in accordance with a position of a shot to be processed first in the exposure process.

9. An exposure method including plural sample shot processes to be made to a substrate and an exposure process to be made to the substrate after completion of the sample shot processes, said method comprising:
   a first determining step for determining the processing order in a first sample shot process, of the plural sample shot processes; and a second determining step for determining the processing order in a second sample shot process to be made after the first sample shot process, wherein, in at least one of said first and second determining steps, the determination is made so that a difference between a position of a shot to be processed last in the first sample shot process and a position of a shot to be processed first in the second sample shot process falls within a range of a single shot with respect to a vertical and longitudinal size in a shot layout.

10. An exposure method including a sample shot process to be made to a substrate and an exposure process to be made to the substrate after completion of the sample shot process, said method comprising:

a first determining step for determining the processing order in the sample shot process; and a second determining step for determining the processing order in the exposure process to be made after the sample shot process, wherein, in at least one of said first and second determining steps, the determination is made so that a difference between a position of a shot to be processed last in the sample shot process and a position of a shot to be processed first in the exposure process falls within a range of a single shot with respect to a vertical and longitudinal size in a shot layout.

11. A device manufacturing method, comprising:

an exposure step including plural sample shot processes to be made to a substrate and an exposure process to be made to the substrate after completion of the sample shot processes, said exposure step further including (i) a first determining step for determining the processing order in a first sample shot process, of the plural sample shot processes, and (ii) a second determining step for determining the processing order in a second sample shot process to be made after the first sample shot process, wherein, in at least one of said first and second determining steps, the determination is made under a condition that an interval between a shot to be processed last in the first sample shot process and a shot to be processed first in the seconds sample shot process is shortened; and a developing step for performing a development process to the substrate having been processed in said exposure step, for production of devices on the substrate.

12. A method according to claim 11, wherein, in said at least one determining step, positions of sample shots are also determined.

13. A device manufacturing method, comprising:

an exposure step including a sample shot process to be made to a substrate and an exposure process to be made to the substrate after completion of the sample shot process, said exposure step further including (i) a first determining step for determining the processing order in the sample shot process, and (ii) a second determining step for determining the processing order in the exposure process to be made after the sample shot process, wherein, in at least one of said first and second determining steps, the determination is made under a condition that an interval between a shot to be processed last in the sample shot process and a shot to be processed first in the exposure process is shortened; and a developing step for performing a development process to the substrate having been processed in said exposure step, for production of devices on the substrate.

14. A method according to claim 13, wherein, in said at least one determining step, positions of sample shots are also determined.

15. A device manufacturing method, comprising:

an exposure step including plural sample shot processes to be made to a substrate and an exposure process to be made to the substrate after completion of the sample shot processes, said exposure step further including (i) a first determining step for determining the processing order in a first sample shot process, of the plural sample shot processes, and (ii) a second determining step for determining the processing order in a second sample shot process to be made after the first sample shot process, in accordance with a position of a shot to be processed last in the first sample shot process; and a developing step for performing a development process to the substrate having been processed in said exposure step, for production of devices on the substrate.

16. A device manufacturing method, comprising:

an exposure step including plural sample shot processes to be made to a substrate and an exposure process to be made to the substrate are completion of the sample shot processes, said exposure step further including (i) a first determining step for determining the processing order in a first sample shot process, of the plural sample shot processes, and (ii) a second determining step for determining the processing order in a second sample shot process to be made prior to the first sample shot process, on the basis of a position of a shot to be processed first in the first sample shot process; and a developing step for performing a development process to the substrate having been processed in said exposure step, for production of devices on the substrate.

17. A device manufacturing method, comprising:

an exposure step including a sample shot process to be made to a substrate and an exposure process to be made to the substrate after completion of the sample shot process, said exposure step further including (i) a first determining step for determining the processing order in the sample shot process, and (ii) a second determining step for determining the processing order in the exposure process to be made after the sample shot process, in accordance with a position of a shot to be processed last in the sample shot process; and a developing step for performing a development process to the substrate having been processed in said exposure step, for production of devices on the substrate.

18. A device manufacturing method, comprising:

an exposure step including a sample shot process to be made to a substrate and an exposure process to be made to the substrate after completion of the sample shot process, said exposure step further including (i) a first determining step for determining the processing order in the exposure process, and (ii) a second determining step for determining the processing order in the sample shot process to be made prior to the exposure process, in accordance with a position of a shot to be processed first in the exposure process; and a developing step for performing a development process to the substrate having been processed in said exposure step, for production of devices on the substrate.

19. A device manufacturing method, comprising:

an exposure step including plural sample shot processes to be made to a substrate and an exposure process to be made to the substrate after completion of the sample shot processes, said exposure step further including (i) a first determining step for determining the processing order in a first sample shot process, of the plural sample shot processes, and (ii) a second determining step for determining the processing order in a second sample shot process to be made after the first sample shot process, wherein, in at least one of said first and second determining steps, the determination is made so that a difference between a position of a shot to be processed last in the first sample shot process and a position of a shot to be processed first in the second sample shot process falls within a range of a single shot with respect to a vertical and longitudinal size in a shot layout; and a developing step for performing a development process to the substrate having been processed in said exposure step, for production of devices on the substrate.

20. A device manufacturing method, comprising:

an exposure step including a sample shot process to be made to a substrate and an exposure process to be made to the substrate after completion of the sample shot process, said exposure step further including (i) a first determining step for determining the processing order in the sample shot process, and (ii) a second determining step for determining the processing order in the exposure process to be made after the sample shot process, wherein, in at least one of said first and second determining steps, the determination is made so that a difference between a position of a shot to be processed last in the sample shot process and a position of a shot to be processed first in the exposure process falls within a range of a single shot with respect to a vertical and longitudinal size in a shot layout; and a developing step for performing a development process to the substrate having been processed in said exposure step, for production of devices on the substrate.

21. An exposure apparatus wherein plural sample shot processes are made to a substrate and an exposure process is made to the substrate after completion of the sample shot processes, said apparatus comprising:

first determining means for determining the processing order in a first sample shot process, of the plural sample shot processes; and second determining means for determining the processing order in a second sample shot process to be made after the first sample shot process, wherein, in at least one of said first and second determining means, the determination is made under a condition that an interval between a shot to be processed last in the first sample shot process and a shot to be processed first in the second sample shot process is shortened.

22. An apparatus according to claim 21, wherein, in said at least one determining means, positions of sample shots are also determined.

23. An exposure apparatus wherein a sample shot process is made to a substrate and an exposure process is made to the substrate after completion of the sample shot process, said apparatus comprising:

first determining means for determining the processing order in the sample shot process; and second determining means for determining the processing order in the exposure process to be made after the sample shot process, wherein, in at least one of said first and second determining means, the determination is made under a condition that an interval between a shot to be processed last in the sample shot process and a shot to be processed first in the exposure process is shortened.

24. An apparatus according to claim 23, wherein, in said at least one determining means, positions of sample shots are also determined.

25. An exposure apparatus wherein plural sample shot processes are made to a substrate and an exposure process is made to the substrate after completion of the sample shot processes, said apparatus comprising:

first determining means for determining the processing order in a first sample shot process, of the plural sample shot processes; and second determining means for determining the processing order in a second sample shot process to be made after the first sample shot process, in accordance with a position of a shot to be processed last in the first sample shot process.

26. An exposure apparatus wherein plural sample shot processes are made to a substrate and an exposure process is made to the substrate after completion of the sample shot processes, said apparatus comprising:

first determining means for determining the processing order in a first sample shot process, of the plural sample shot processes; and second determining means for determining the processing order in a second sample shot process to be made prior to the first sample shot process, on the basis of a position of a shot to be processed first in the first sample shot process.

27. An exposure apparatus wherein a sample shot process is made to a substrate and an exposure process is made to the substrate after completion of the sample shot process, said apparatus comprising:

first determining means for determining the processing order in the sample shot process; and second determining means for determining the processing order in the exposure process to be made after the sample shot process, in accordance with a position of a shot to be processed last in the sample shot process.

28. An exposure apparatus wherein a sample shot process is made to a substrate and an exposure process is made to the substrate after completion of the sample shot process, said apparatus comprising:

first determining means for determining the processing order in the exposure process; and second determining means for determining the processing order in the sample shot process to be made prior to the exposure process, in accordance with a position of a shot to be processed first in the exposure process.

29. An exposure apparatus wherein plural sample shot processes are made to a substrate and an exposure process is made to the substrate after completion of the sample shot processes, said apparatus comprising:

first determining means for determining the processing order in a first sample shot process, of the plural sample shot processes; and second determining means for determining the processing order in a second sample shot process to be made after the first sample shot process, wherein, in at least one of said first and second determining means, the determination is made so that a difference between a position of a shot to be processed last in the first sample shot process and a position of a shot to be processed first in the second sample shot process falls within a range of a single shot with respect to a vertical and longitudinal size in a shot layout.

30. An exposure apparatus wherein a sample shot process is made to a substrate and an exposure process is made to the substrate after completion of the sample shot process, said apparatus comprising:

first determining means for determining the processing order in the sample shot process; and second determining means for determining the processing order in the exposure process to be made after the sample shot process, wherein, in at least one of said first and second determining means, the determination is made so that a difference between a position of a shot to be processed last in the sample shot process and a position of a shot to be processed first in the exposure process falls within a range of a single shot with respect to a vertical and longitudinal size in a shot layout.

31. A method of a first process to be performed to a plurality of shots on a substrate consecutively and a second process to be performed to a plurality of shots on the substrate consecutively, wherein the first process is to be performed before the second process and wherein at least the first process is a sample shot process, said method comprising:

a step of determining an order in which at least one of the first and second processes is to be performed to the plurality of shots, based on a distance between two shots to be processed consecutively by the first and second processes, respectively.

32. A device manufacturing method comprising:

a first process, being a sample process, performed to a plurality of shots on a substrate consecutively;

a second process performed, after the first process, to a plurality of shots on the substrate consecutively; and a step of determining an order in which at least one of the first and second processes is to be performed to the plurality of shots based on a distance between two shots to be processed consecutively by the first and second processes, respectively.

33. A device manufacturing apparatus comprising:

first process means for performing a first process being a sample shot process, to a plurality of shots on a substrate consecutively;

second process means for performing a second process to a plurality of shots on the substrate consecutively, after the first process means performs the first process; and determining means for determining an order in which at least one of the first and second processes is to be performed to the plurality of shots based on a distance between two shots to be processed consecutively by the first and second processes, respectively.

* * * * *

UNITED STATES PATENT AND TRADEMARK OFFICE
CERTIFICATE OF CORRECTION

PATENT NO. : 6,784,974 B1
DATED : August 31, 2004
INVENTOR(S) : Hiroki Suzukawa

It is certified that error appears in the above-identified patent and that said Letters Patent is hereby corrected as shown below:

Column 1,
Line 9, "process-for" should read -- process for --.

Column 2,
Line 43, "threat" should read -- thereat --.

Column 4,
Line 2, "first." should read -- first --.
Line 45, "However;" should read -- However, --.
Line 59, "pin" should be deleted.

Column 7,
Line 45, "dr" should read -- or --.

Column 9,
Line 39, "seconds" should read -- second --.

Column 10,
Line 19, "are" should read -- after --.

Signed and Sealed this

Fourteenth Day of December, 2004

JON W. DUDAS
*Director of the United States Patent and Trademark Office*